United States Patent
Tsironis

(10) Patent No.: US 7,561,004 B1
(45) Date of Patent: Jul. 14, 2009

(54) HARMONIC REJECTION TUNER WITH ADJUSTABLE RESONATORS

(76) Inventor: Christos Tsironis, 44 Caribou Cr., Kirkland, Quebec (CA) H9J 2H8

(*) Notice: Subject to any disclaimer, the term of this patent is extended or adjusted under 35 U.S.C. 154(b) by 18 days.

(21) Appl. No.: 11/471,528

(22) Filed: Jun. 21, 2006

(51) Int. Cl.
*H03H 7/38* (2006.01)
*G01R 27/00* (2006.01)

(52) U.S. Cl. .................. 333/17.3; 333/263; 324/642
(58) Field of Classification Search ............ 333/17.3, 333/263, 33; 324/76.49, 76.11, 76, 76.51, 324/642, 49, 613
See application file for complete search history.

(56) References Cited

U.S. PATENT DOCUMENTS

2001/0024117 A1* 9/2001 Kiyokawa et al. ........ 324/76.49
2006/0139130 A1* 6/2006 Boulerne ................. 333/263

OTHER PUBLICATIONS

Product Note 41- Computer Controlled Microwave Tuner—CCMT, 1998.

* cited by examiner

*Primary Examiner*—Stephen E Jones

(57) ABSTRACT

A harmonic rejection tuner, used for reflecting RF power at the harmonic frequencies in a load pull measurement setup, uses adjustable capacitive loading of open quarter wavelength long resonator stubs in order to vary the electrical length and thus the resonant frequency of the resonators. Since the resonators themselves are by nature narrowband, this frequency adjustability allows for a higher frequency bandwidth and better coverage of operational frequency range of the test setup. Since load pull measurements are carried out mostly at fixed frequencies, adjustment of the capacitive loading can be either manual or by remote control. Capacitive loading the resonator stubs allows DC bias to be applicable to the device under test through the tuner.

7 Claims, 16 Drawing Sheets

Cross section of harmonic rejection tuner using a pair of open-stub resonators with adjustable capacitive loading for modifying the resonance frequency

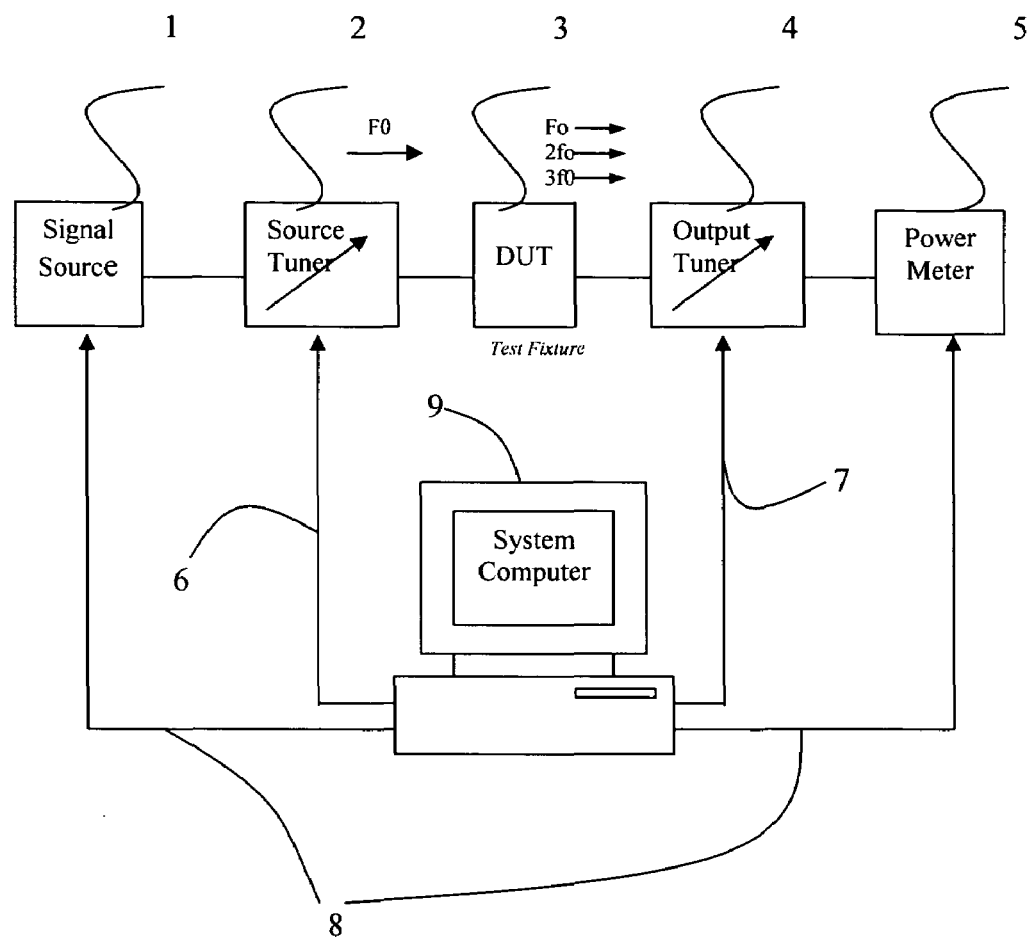
Figure 1: Prior Art - Typical Load Pull Set-up

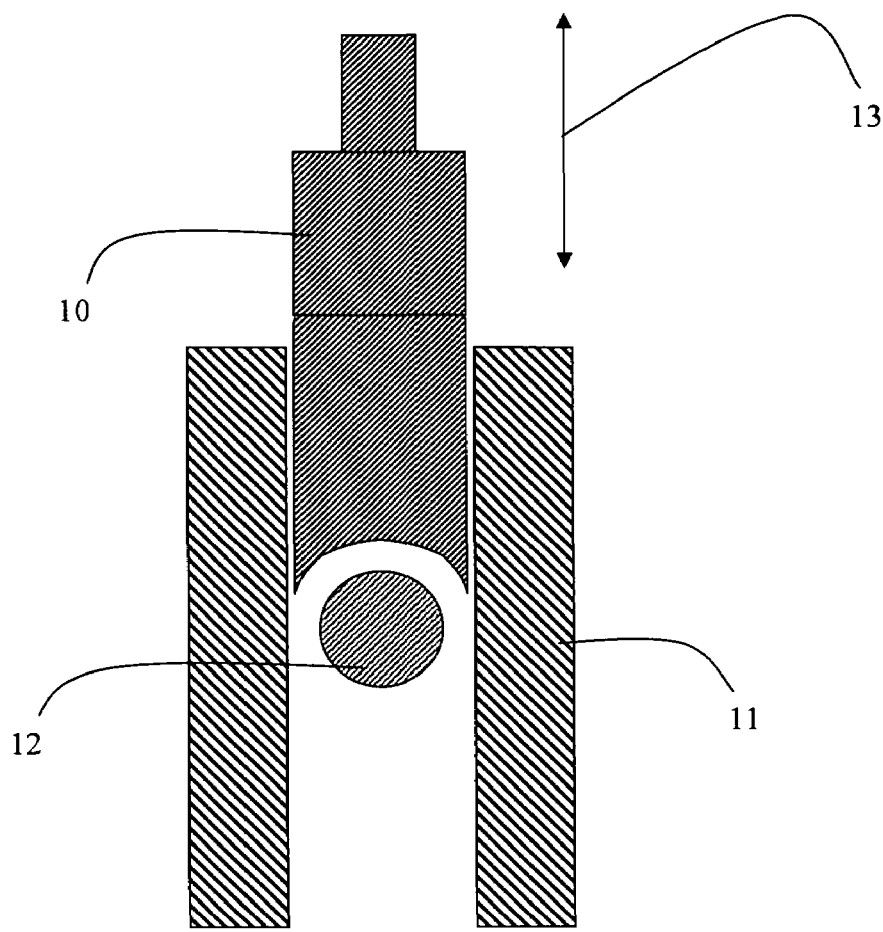
FIGURE 2: Prior Art - Cross Section of Slide Screw Load Pull Tuner

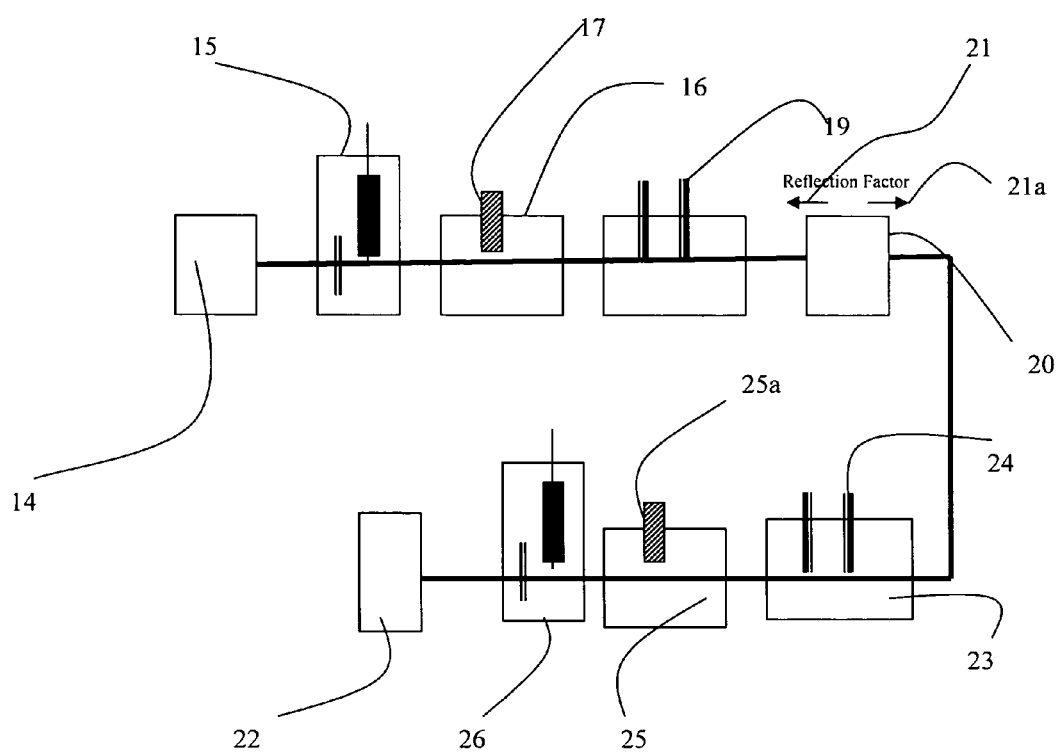
FIGURE 3: Prior Art - Harmonic Load Pull set-up using harmonic rejection tuners based on open stub λ/4 resonators

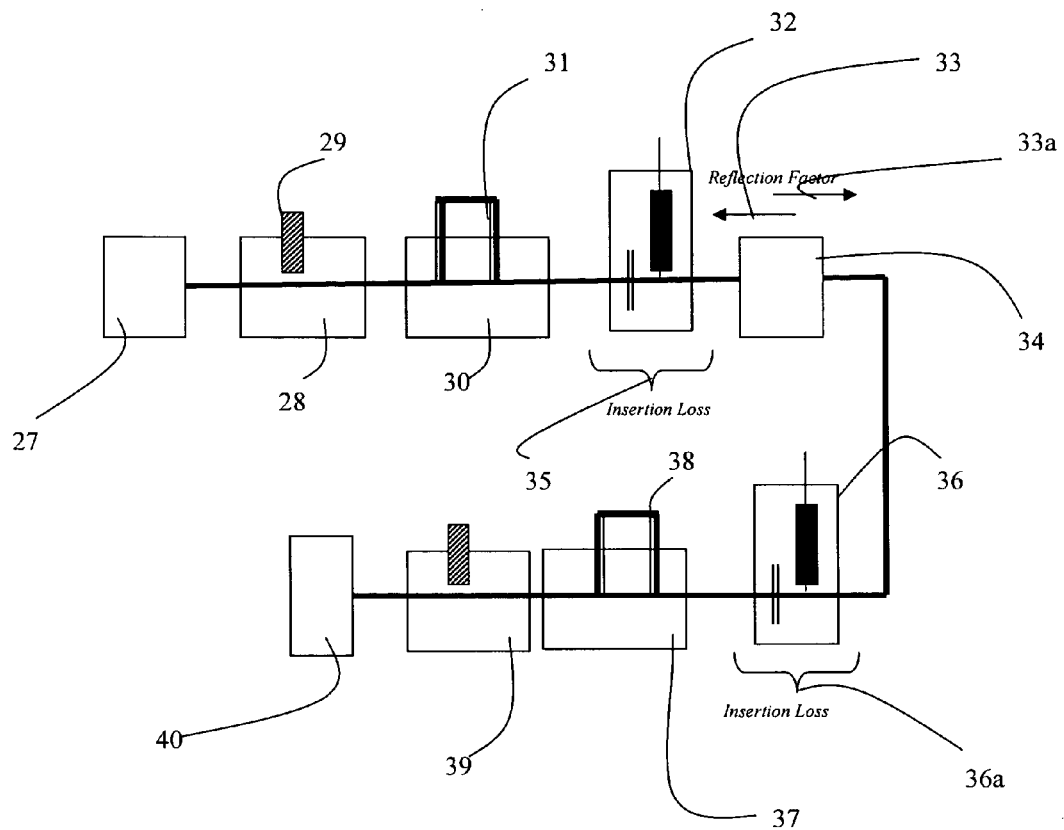
FIGURE 4: Prior Art – Harmonic Load Pull setup using harmonic tuners with λ/2 shorted stub resonators.

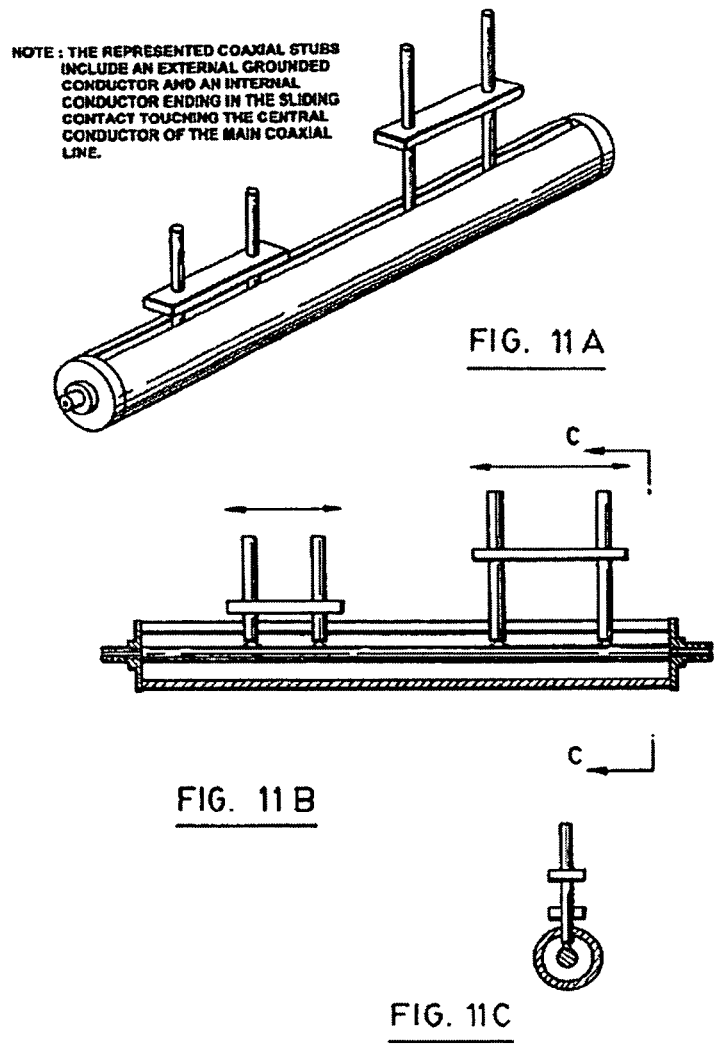
FGURE 5 [1]: Prior Art – Harmonic rejection tuner using λ/4 open stub resonators

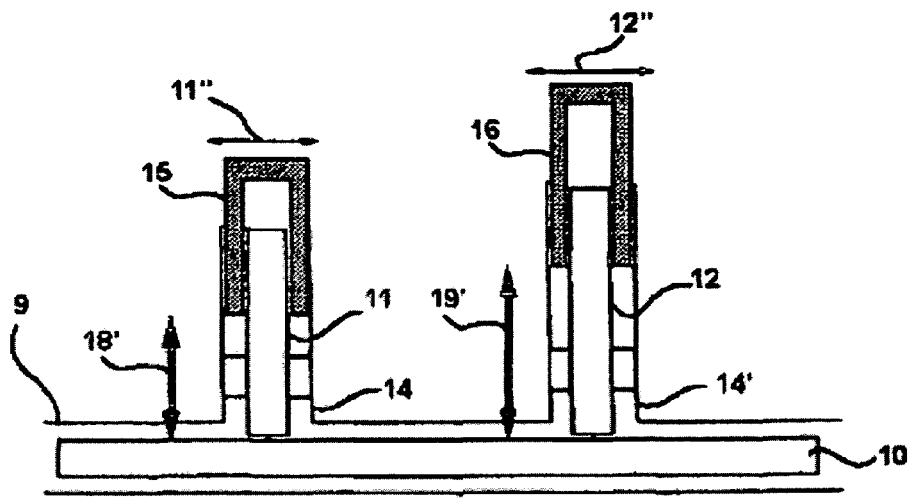
FIGURE: 6   Prior Art:
Claim 7: shorted-stub further includes another resonator adapted to compensate the effect of the corresponding moveable shorted-stub on the reflection factor at the base frequency F0, said other resonator having a configuration identical to the corresponding moveable shorted-stub <u>and being mechanically attached thereto.</u>

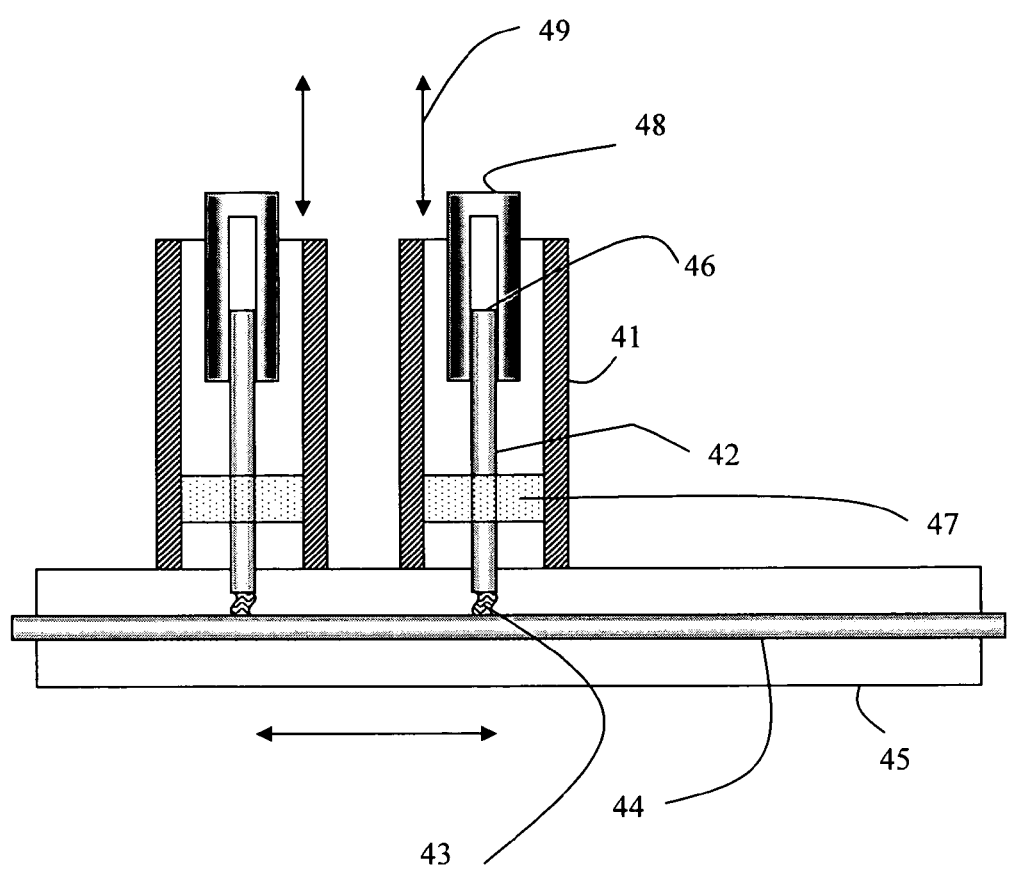
FIGURE 7: Cross section of harmonic rejection tuner using a pair of open-stub resonators with adjustable capacitive loading for modifying the resonance frequency

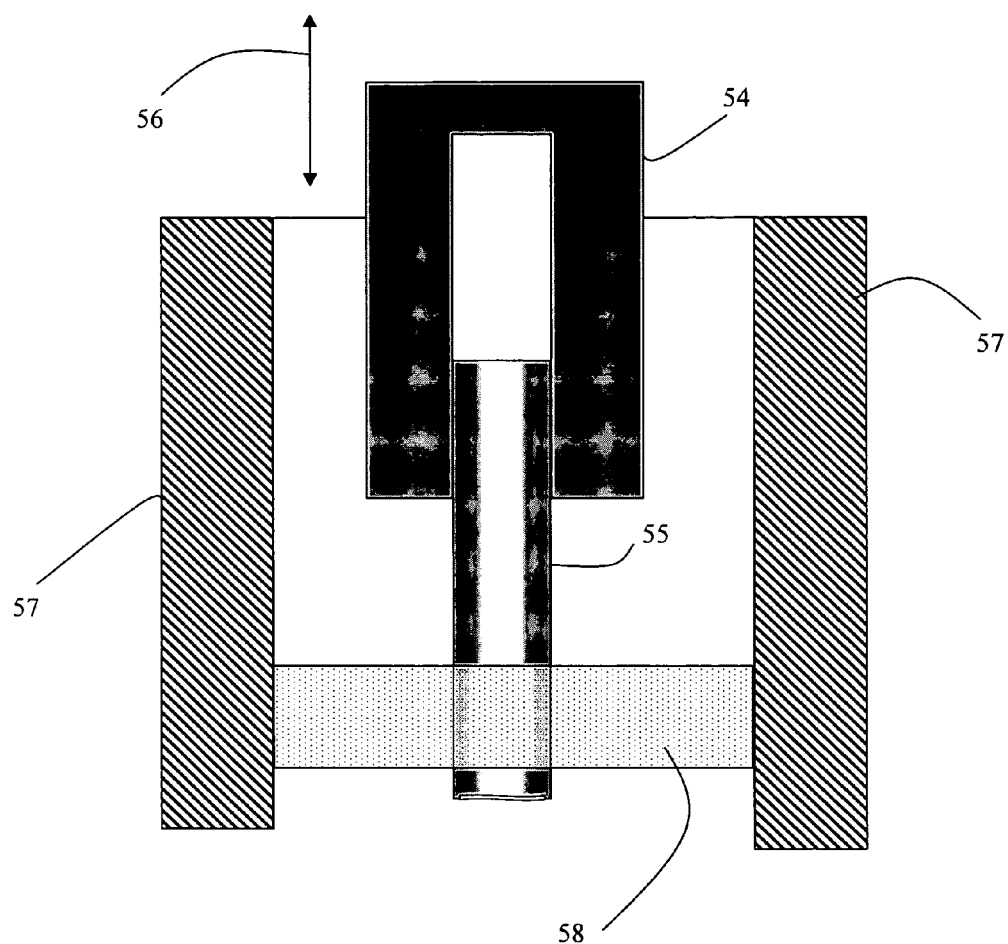
FIGURE 8: Detail view cross section of the free standing capacitive load of λ/4 open stub harmonic resonator

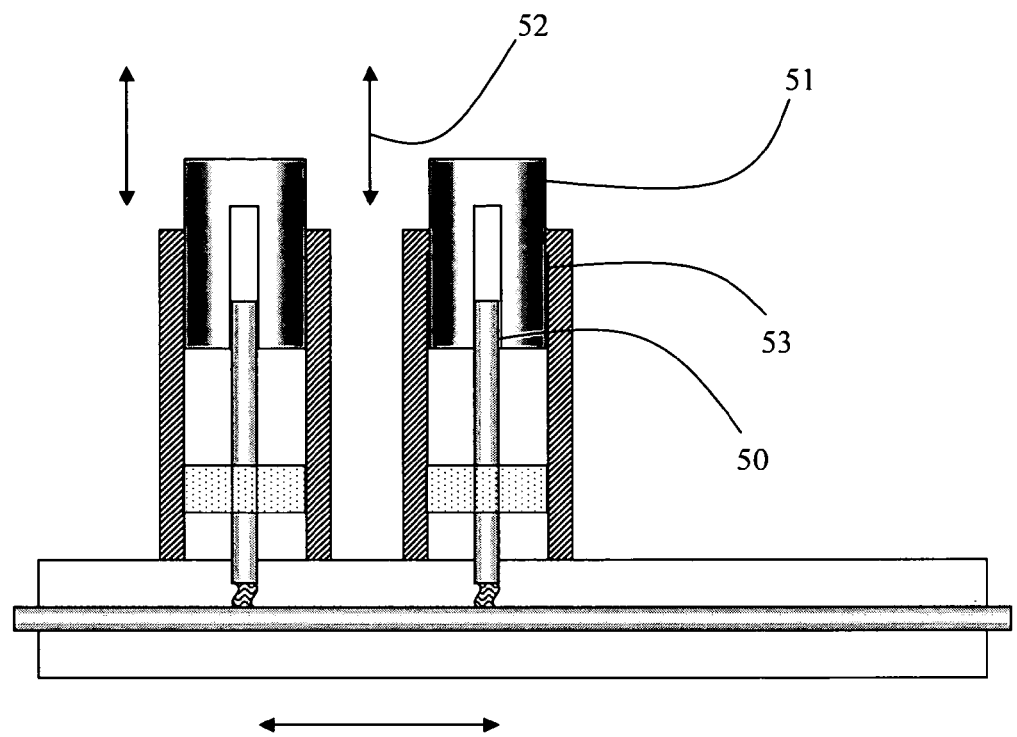
FIGURE 9: Cross section of harmonic rejection tuner using a pair of capacitive loaded stub resonator

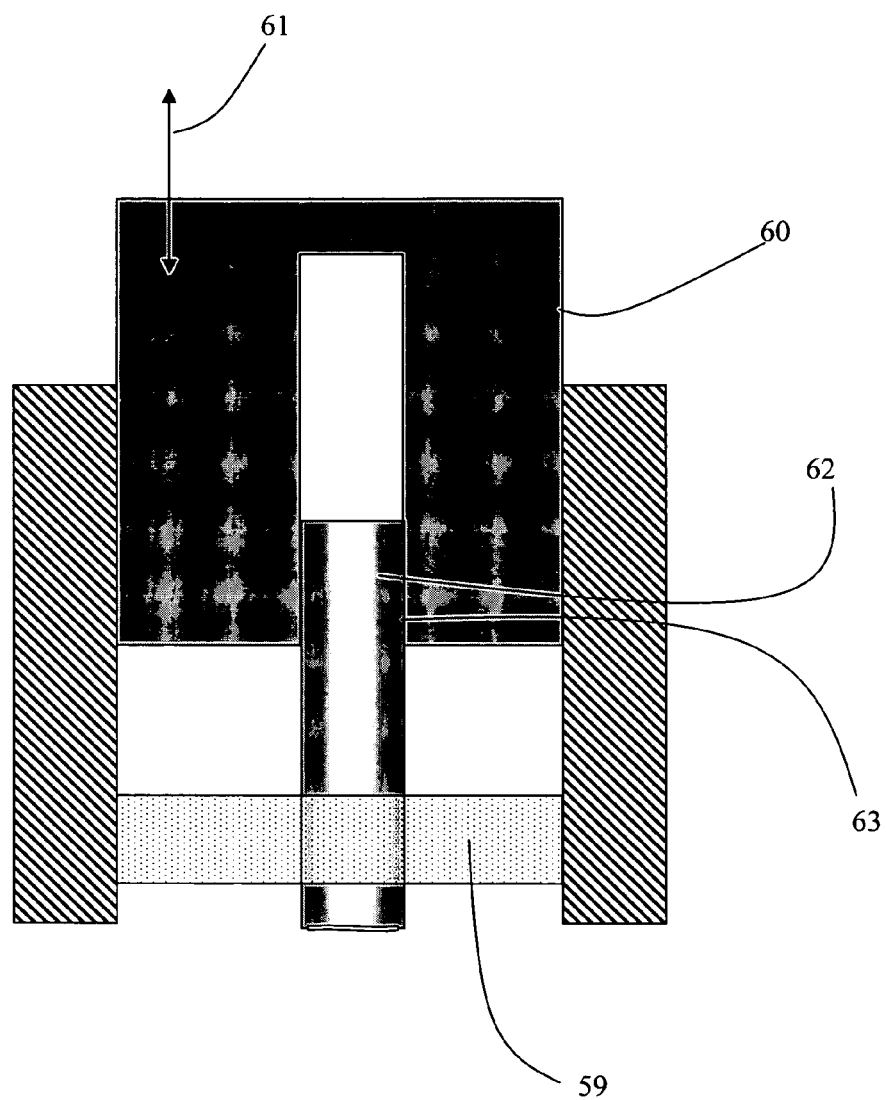
FIGURE 10: Detail view cross section of close fitting capacitive load to λ/4 open stub harmonic resonator

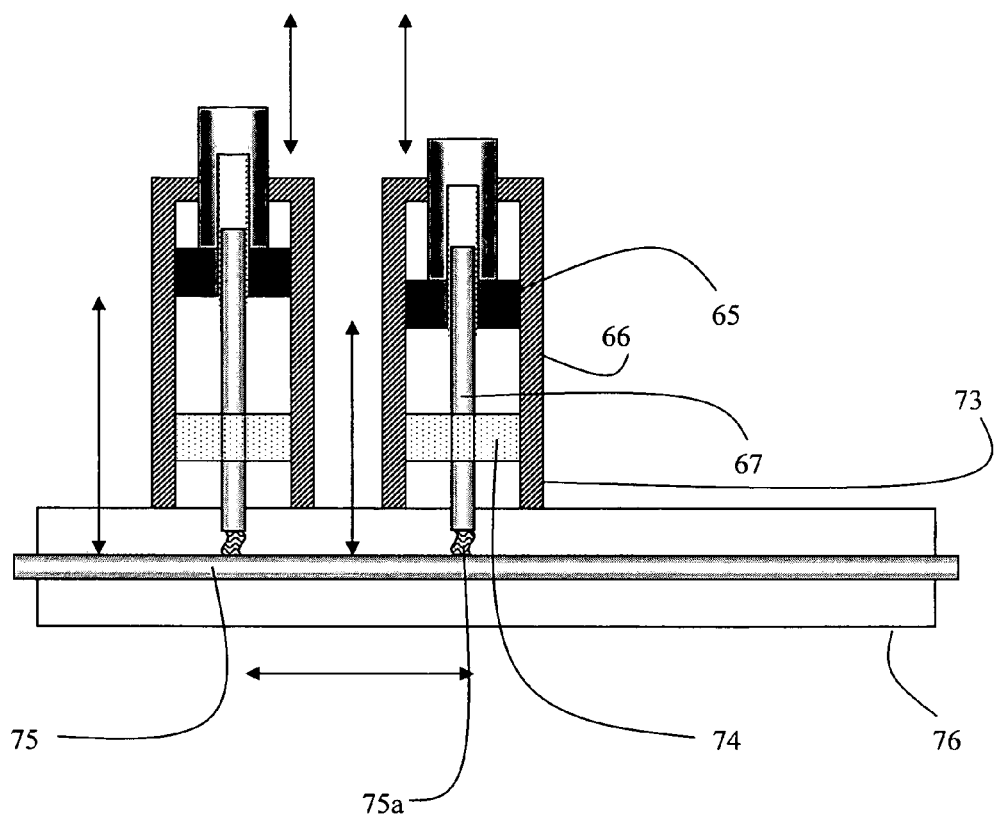
FIGURE 11: Cross section of harmonic rejection tuner using a pair of capacitive adjustable shorted λ/2 stub resonators

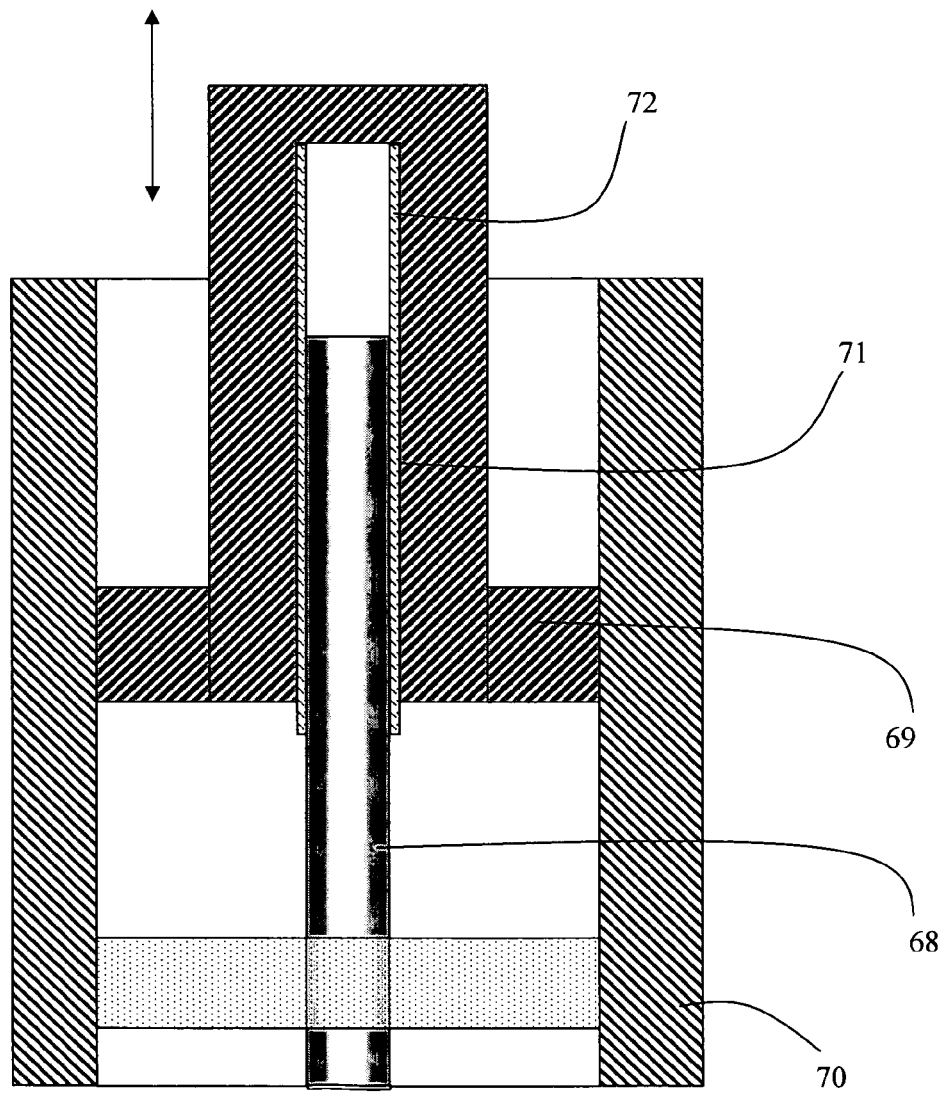
FIGURE 12: Detail view of cross section of adjustable capacitive shorts applied on λ/2 resonator stubs

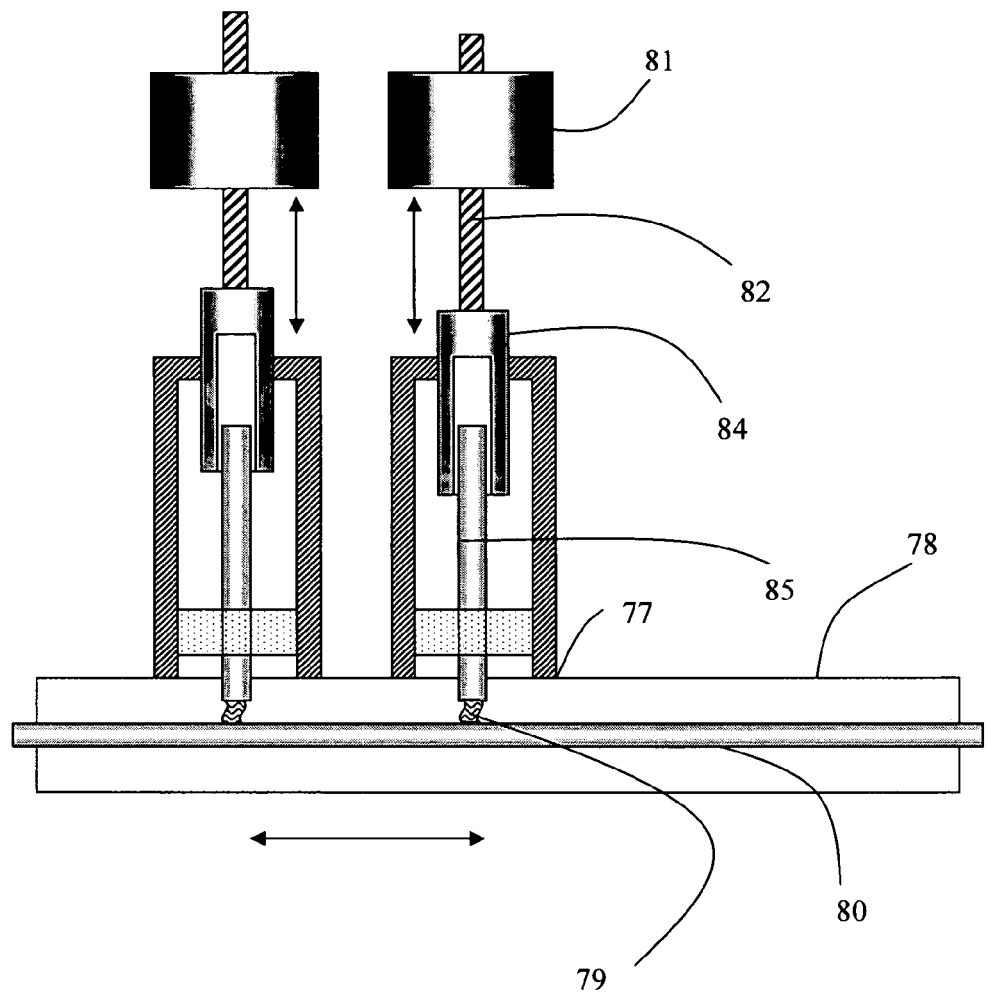
FIGURE 13: Cross section of semi-automated harmonic rejection tuner, in which the resonance frequency of open λ/4 resonators is adjusted by computer control.

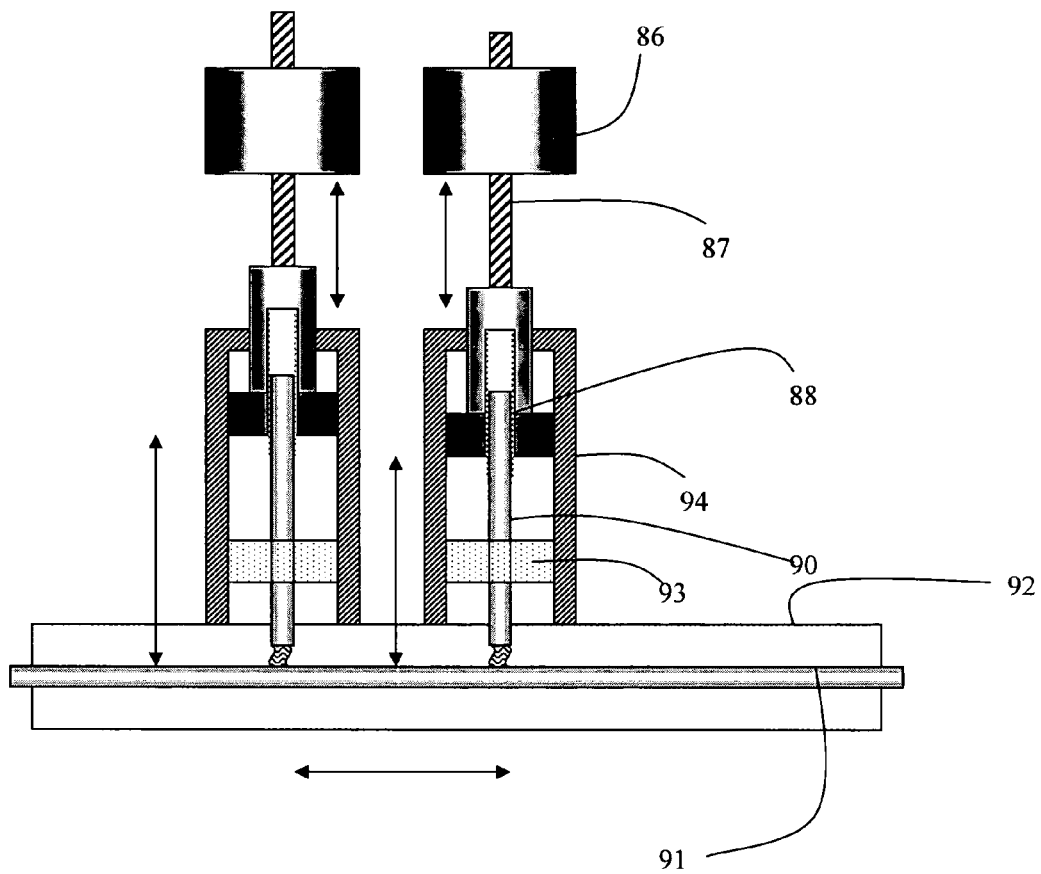
FIGURE 14: Cross section of semi-automated harmonic rejection tuner, in which the resonance frequency of capacitive shorted λ/2 resonators is adjusted by computer control

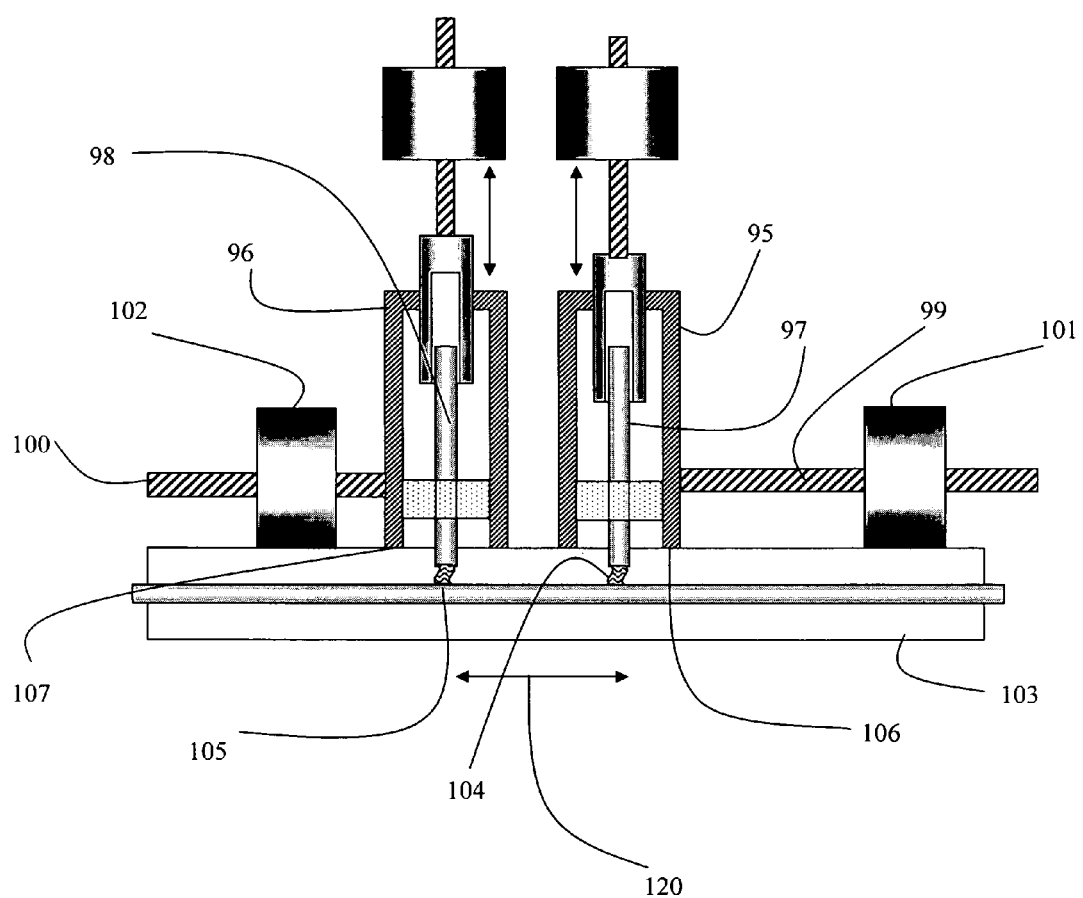
FIGURE 15: Cross section of harmonic rejection tuner using λ/4 open stub resonators with fully automated resonance frequency adjustment

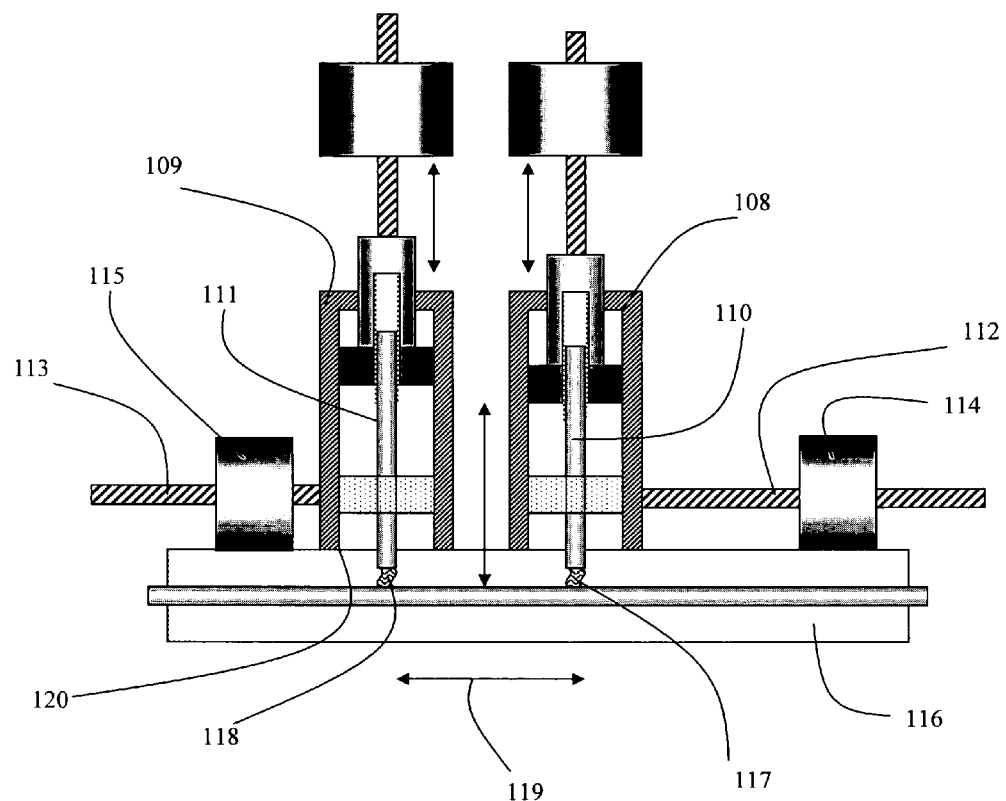
FIGURE 16: Cross section of harmonic rejection tuner using capacitive shorted λ/2 stub resonators with fully automated resonance frequency adjustment

HARMONIC REJECTION TUNER WITH ADJUSTABLE RESONATORS

PRIORITY CLAIM

Not Applicable

CROSS-REFERENCE TO RELATED ARTICLES

[1] U.S. Pat. No. 6,297,649, "Harmonic rejection load tuner", Christos Tsironis
[2] U.S. Pat. No. 7,042,233, "Harmonic rejection tuner", Philippe Bouleme
[3] "Computer Controlled Microwave Tuner System—CCMT", Product Note 41, Focus Microwaves

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors, which use automatic microwave tuners in order to synthesize reflection factors (or impedances) at the input and output of the transistors at various harmonic frequencies.

Modern design of high power microwave amplifiers, oscillators and other active components used in various communication systems requires accurate knowledge of the active device's (microwave transistor's) characteristics. In such circuits, it is insufficient and inaccurate for the transistors operating at high power in their highly non-linear regions and close to saturation, to be described using analytical or numerical models only. Instead the devices must be characterized using specialized test setups under the actual operating conditions.

A popular method for testing and characterizing such microwave components (transistors) for high power operation is "load pull" and "source pull". A typical load pull setup is shown in FIG. 1. It includes a signal source 1, a microwave source tuner 2, a test fixture 3 in which a device under test (DUT) is mounted, an output tuner 4 and a power meter 5. The tuners 2, 4 and the test equipment 1, 5 are remotely controlled 6, 7, 8 by a system computer 9 running appropriate software for tuner control and instrument communication (GPIB) for data collection and processing.

The microwave tuners 2, 4 in the setup of FIG. 1 synthesize the microwave impedances presented to the DUT 3 for which the test takes place. The end-result of a load pull testing session is the dependence of DUT parameters, like Gain, Power and Efficiency etc. on load and source impedance, created by the load and source tuners.

Electro-mechanical tuners [3] have several advantages compared to electronic and active tuners, namely long-term stability, higher handling of microwave power, easier operation and lower cost. Electro-mechanical tuners are made using the slide-screw concept, of which a cross section is shown in FIG. 2, which employs adjustable mechanical obstacles (probes or "slugs") 10 inserted into the transmission media of the tuners, which is a slotted coaxial or parallel plate airline (slabline) 11, FIG. 2, at an adjustable distance from the central conductor 12; this insertion 13 of the slugs creates capacitive coupling between probe and central conductor and allows to reflect part of the power coming out of the DUT output port back into the DUT and to create, this way, a controllable reflection factor (or impedance) that is presented to the DUT.

When the DUT's (transistors) operate at high power, close to power saturation, they become strongly non-linear and deform the sinusoidal input signal injected by the signal source and therefore, following Fourier's law, they generate power at harmonic frequencies. If the injected signal is at a fundamental frequency fo then harmonic power is generated at $2fo$, $3fo$, $4fo$ etc. (FIG. 1). This harmonic power is normally lost when fed into a wideband RF load 5 and reduces the operational efficiency of the transistor 3. A test method, which allows the harmonic power to be recovered and re-injected back into the DUT, is called "harmonic load pull". Harmonic load pull uses harmonic tuners in order to manipulate the impedances at the harmonic frequencies. A typical harmonic load pull setup is shown in FIG. 3.

DESCRIPTION OF PRIOR ART

The harmonic load pull setup of FIG. 3, uses a signal source 14, an input bias tee 15 for applying control voltage to the DUT 18, a wideband input tuner 16, which uses a capacitively coupled probe 17, and an input harmonic rejection tuner 18 [1], which uses two sets of open $\lambda/4$ resonator stubs 19, before the DUT 20. The combination of wideband tuner 16 and harmonic tuner 18 allows controlling the reflection factor (or impedance) 21, seen by the DUT 20 at the fundamental frequency fo and the harmonic frequencies $2fo$ and $3fo$.

The same is achieved in the setup of FIG. 3 in the section between DUT 20 and load 22: A harmonic rejection tuner 23 using $\lambda/4$ open stubs 24 is inserted between DUT 20 and wideband load tuner 25, which also uses capacitively coupled probes, 25a, and to an output bias tee 26, which serves to apply output supply voltage to the DUT 20. On both sides of the DUT 20, towards the signal source 14 and the load 22, designated here as "source" and "load" side of the DUT correspondingly, the reflection factors 21 and 21a are maximized, because the insertion loss of any section between DUT 20 and tuners 18, 23 is minimized.

Harmonic rejection tuners, as used in the setup of FIG. 3 are described in [1], FIG. 5. They use a slotted airline (slabline) and a set of open stubs with a length of $\lambda/4$ at the harmonic frequency, which slide on top of the central conductor of the slabline. The open stubs create serial resonance, which corresponds to an RF short circuit at the contact point with the central conductor 43 at the harmonic frequency, thus reflecting back harmonic power to the transistor. By moving the open stubs along the slotted airline the phase of the microwave reflection factor can be freely controlled. This, in general, creates test conditions satisfying most measurement requirements for harmonic load pull [1].

Another possible configuration of such "harmonic rejection" tuners uses galvanically shorted stubs [2], FIG. 6, instead of open stubs [1]. In the case of shorted stubs the length of each stub must be $\lambda/2$ at the harmonic frequency. The galvanic short is then transformed by the $\lambda/2$ length of the stub into another RF short at the reference plane of the central conductor 75a FIG. 11. The effective length and therefore the resonant frequency of such resonators may be modified by moving the galvanic short closer or further away from the central conductor using perfect sliding metallic contacts [2].

Harmonic rejection tuners using galvanized adjustable shorted stubs [2] have a number of practical disadvantages:

A first disadvantage is that harmonic rejection tuners using shorted stubs [2] cannot be used in a setup as shown in FIG. 3; this is because the DC shorts, as described in [2] will not allow the DUT 20 to be biased. Therefore an alternated test setup, as shown in FIG. 4 must be used.

In this setup (FIG. 4) the signal source 27 injects a signal into the DUT 32 through a wideband tuner 28 using capacitive probes (slugs) 29 followed by the harmonic rejection tuner 30 using galvanized shorted $\lambda/2$ stub resonators 31 and a bias tee 32; the reflection factor 33 seen by the DUT 34 is lower than in the setup of FIG. 3, because of the insertion loss 35 of the bias tee 32. The same is valid at the output of the DUT 34, where an output bias tee 36 must be inserted between the DUT 34 and the load harmonic rejection tuner 37, the wideband load tuner 39 and the microwave load 40; the reason for this is, that the output harmonic rejection tuner 37 uses shorted stub resonators 38, which do not allow DC bias to reach the DUT 34. For the same reasons as before the reflection factor 39 and therefore the tuning range, seen by the DUT 34, is going to be reduced, compared with the setup in FIG. 3.

Another disadvantage of harmonic rejection tuners using shorted stubs [2] is that the galvanic short circuits at the end of the stubs will create short circuits not only at the harmonic frequencies, which are in general quite high, in the GHz range, but also at lower frequencies down to DC, as seen by the transistor DUT 34 and this, because the gain of the transistor DUT's is always much higher at lower frequencies, always creates favorable conditions for spurious low frequency oscillations of the whole test system, in which case testing becomes impossible.

To avoid the problems associated with galvanic shorts [2] we propose a harmonic rejection tuner apparatus where only RF shorts, that is short circuits effective only above a certain frequency, are used; this is possible through capacitive coupling between the resonator stubs and the ground plane surrounding them; these capacitive shorts can be moved up and down along the resonator stub to adjust their effective length and their resonance frequency, while at the same time there is no galvanic contact between the resonator stubs themselves and the ground, which would prevent the application of DC bias voltage and current on the DUT; in addition capacitively coupled shorts generate low reflection at low frequencies, thus reducing the risk for spurious oscillations of the DUT.

We also propose an arrangement for resonance frequency adjustment of open $\lambda/4$ stubs as described in [1]; this is made using movable dielectric cylinders (rods or tubes), which slide over the open stub and add adjustable electrical length by creating an adjustable capacitive load.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts Prior Art; a load pull test set-up using passive electro-mechanical tuners.

FIG. 2 depicts Prior Art; cross section of slide screw Load Pull Tuner

FIG. 3 depicts Prior Art; a harmonic Load Pull setup using harmonic rejection tuners based on open stub $\lambda/4$ resonators FIG. 4 depicts a harmonic Load Pull setup using harmonic rejection tuners with $\lambda/2$ shorted stub resonators FIG. 5 depicts Prior Art; a harmonic rejection tuner using $\lambda/4$ open stub resonators.

FIG. 6 depicts Prior Art; a harmonic rejection tuner using $\lambda/2$ shorted stub resonators.

FIG. 7 depicts a cross section of a harmonic rejection tuner using a pair of open-stub resonators with adjustable capacitive loading for modifying the resonance frequency.

FIG. 8 depicts a detail cross section view of a free standing capacitive load of $\lambda/4$ open stub harmonic resonator.

FIG. 9 depicts a cross section of a harmonic rejection tuner using a pair of capacitive loaded stub resonators.

FIG. 10 depicts a detail cross section view of close fitting capacitive load $\lambda/4$ open stub harmonic resonators.

FIG. 11 depicts a cross section view of a harmonic rejection tuner using a pair of capacitively shorted adjustable $\lambda/2$ stub resonators.

FIG. 12 depicts a detail cross section view of adjustable capacitive shorts applied on $\lambda/2$ resonator stubs.

FIG. 13 depicts a semi-automated harmonic rejection tuner, in which the resonance frequency of open $\lambda/4$ resonators is adjusted by computer control.

FIG. 14 depicts a cross section view of a semi-automated harmonic rejection tuner, in which the resonance frequency of capacitive shorted $\lambda/2$ resonators is adjusted by computer control.

FIG. 15 depicts a cross section view of a harmonic rejection tuner using $\lambda/4$ open stub resonators with fully automated resonance frequency adjustment.

FIG. 16 depicts a cross section view of a harmonic rejection tuner using capacitive shorted $\lambda/2$ stub resonators with fully automated resonance frequency adjustment.

DETAILED DESCRIPTION OF THE INVENTION

The present invention describes harmonic rejection tuner configurations, which allow adjustability of the frequency of operation, while at the same time being free of practical problems and limitations of previously proposed alternatives.

The proposed harmonic rejection tuner is similar to prior art [1] as depicted in FIG. 5 comprising a transmission media in form of a slotted coaxial or parallel plate airline (slabline) with an input (test) and an output (idle) port and one set of two harmonic resonators per harmonic frequency to be rejected (reflected back to the DUT), said test port being connected to the device under test (DUT) and said idle port being connected to the RF source or load (FIGS. 3,4).

The harmonic resonators are made of a coaxial structure comprising an external ground conductor 41 and a metallic stub 42 serving as central conductor of the resonator, which has sliding galvanic contact on its bottom end 43 with the central conductor 44 of the airline 45 and is either open [1] or shorted [2] on the top end 46; said central conductor stub of the resonator 42 being centered and secured against the metallic ground walls of said resonator by means of low loss and low dielectric constant dielectric washers 47.

In a first configuration (FIG. 7) the $\lambda/4$ open resonator stubs of the tuner disclosed in [1], the top end 46 of each resonator stub 42 is embedded in a dielectric cylinder 48, which creates a capacitive load to the resonator stub 42, as it is moved up and down 49 in such a way as to increase or decrease the depth at which the open end of the stub is inserted inside the dielectric material 49.

A detail view of the free-standing capacitive load of $\lambda/4$ open stub resonators is shown in FIG. 8. The open stub is secured against the ground walls by a low dielectric washer 58. The dielectric cylinder 54 slides vertically 56 and closely fitting on the open stub 55, but free standing inside the cylindrical resonator ground walls 57. This creates a relatively small capacitive load, but ensures continuous operation, because there are no critical sliding contacts with the ground walls 57.

In a second configuration of the open stub λ/4 harmonic resonators (FIG. 9) the dielectric load consists of dielectric cylinders 51 which envelop the open stub closely 50 and can be moved up and down 52 in such a way as to increase or decrease the capacitive load and therefore the effective electrical length of the resonators and their resonance frequency. Compared with the configuration in FIGS. 7 and 8, where the dielectric cylinder 48 is free standing, in the configuration of FIG. 9 the dielectric cylinder makes sliding contact with the ground plane 53 and this increases the capacitive load and therefore the range of frequency tuning. A disadvantage of this contacting dielectric load 51 is that, would the sliding contact not be perfect, the capacitive load may change abruptly and cause a jump in resonance frequency.

A detail view of the closely fitting capacitive load of λ/4 open stub resonators is shown in FIG. 10. The open stub is secured against the ground walls by a low loss dielectric washer 59. The dielectric cylinder 60 slides vertically 61 and closely fitting on the open stub 62 as well as on the inside 63 of the cylindrical ground walls 64. This creates a higher capacitive load than in the configuration of FIG. 8 at the risk of discontinuity of frequency tuning as described before.

In a third configuration (FIG. 11) the galvanically shorted λ/2 resonator stubs used in the tuner disclosed in [2] (FIG. 6), the galvanic shorts between the resonator stubs (11-15 and 12-16 in FIG. 6) and the ground plane are replaced by capacitive shorts 65 (FIG. 11) between the resonator stubs 67 and a metallic cylinder 66; details are shown in FIG. 12. The resonator stubs 67 themselves are centered inside the cylindrical metallic ground plane 73 by means of low loss dielectric washers 74 and make sliding metallic contact with the central conductor 75 of the slabline 76.

FIG. 12 shows a detail of the capacitive shorts applied on λ/2 resonator stubs 68; said capacitive shorts are made using a metallic ground rod 69, which slides on the inner side of the cylindrical ground walls 70 and makes perfect galvanic ground contact, whereas on the inside diameter 71 it is isolated from the λ/2 resonator stub 68 by a thin dielectric film 72 such as Capton or Mylar, which are flexible dielectric materials of high dielectric constant and high durability, able to withstand for long periods of time friction caused by the two metals, the resonator stubs 68 and the surrounding metallic cylinders 69 sliding one inside the other. The thickness of such dielectric films is on the order of 0.002" to 0.004" with dielectric constants between 4 and 10, thus creating sufficient capacitive coupling between the resonator stubs 68 and the ground 69 for effective short circuiting the resonator stubs above a few hundred MHz.

Shorted capacitive stubs 67 allows harmonic rejection tuners to be used in setups as shown The resonators in all hitherto tuner configurations, FIGS. 13-15, are mounted into appropriate holdings (carriages) which are driven by lead screws and computer controlled stepper motors and slide on top of the slabline in such a manner as to make perfect galvanic contact between the bottom of the resonators 77 and the top 78 of the slabline 81 and the bottom tip of the resonator stubs 79 with the top of the central conductor 80 of the slabline 81.

FIGS. 7, 9 and 11 show harmonic tuners with manually adjustable resonance frequency of the harmonic resonators. In a first semi-automated configuration the depth of the dielectric loads of the λ/4 open stub resonators (FIG. 13) are remotely controlled by stepper motors 81 and lead screws 82 are attached to the dielectric cylinders 84 and can move them deeper over the resonator stubs 85 to modify the capacitive load and thus the electric length and resonance frequency of the resonators.

A similar semi-automated setup is used in the case of shorted λ/2 stub resonators (FIG. 15); in this case, same as in the apparatus in FIG. 13, computer controlled stepper motors 86 and lead screws 87 hold the sliding shorts 88 capacitively coupled 89 to the resonator stubs 90, which slide on the central conductor 91 of the slabline 92. The resonator stubs 90 are centered and secured inside the ground walls 94 of the resonators using low loss dielectric washers 93.

In previously presented harmonic rejection tuners, [1] [2], there is a solid adjustable link between resonators of the same harmonic frequency, as shown in FIG. 5 (prior art, FIGS. 11A and 11B of [1]). One of the carriages is then linked to a remote control mechanism consisting of a lead screw, gear, stepper motor and computerized control, which allows positioning the set of both resonators at will along the slotted airline. In this case the horizontal distance between resonators must be re-adjusted manually for each new resonance frequency.

In a fully automated configuration (FIG. 15) each carriage 95, 96 carrying a harmonic resonator 97, 98 is linked to a remote moving mechanism, consisting of lead screws 99, 100, and stepper motors 101, 102, linked to a computerized control and can be moved at will along the said airline 103, making sure that the sliding contacts, both of the central conductor of the resonator with the central conductor of the airline 104, 105 and of the ground conductor of the resonator with the ground conductor of the airline 106, 107 are perfect and continuous during the movement.

The equivalent setup for harmonic rejection tuners using capacitively shorted λ/2 resonators [2] is shown in FIG. 16: each carriage 108, 109 carrying a harmonic resonator 110, 111 is linked to a remote moving mechanism, consisting of lead screws 112, 113 and stepper motors 114, 115, linked to a computerized control and can be moved at will along the said airline 116, making sure that the sliding contacts, both of the central conductor of the resonator with the central conductor of the airline 117, 118 and of the ground conductor of the resonator with the ground conductor of the airline 119, 120 are perfect and continuous during the movement.

Whereas the configuration proposed in [1], FIG. 5 lacks the capacity to adjust the resonance frequency of the open stubs, the configuration proposed in [2], FIG. 6 uses galvanic shorted stubs 15,16 in [2], which do not allow DC power to traverse the tuner and reach the DUT, and is prone to low frequency spurious oscillations of the device under test (DUT, transistor).

The tuner proposed here eliminates all these shortcomings by using variable capacitive loads of the open stubs in [1] and capacitively coupled shorts of the shorted stubs in [2].

As can be seen in FIGS. 7 to 10 the open stubs 46 of the parallel open stub resonators are surrounded by a tube made of dielectric material 48. This dielectric cylinder may or may not touch the ground plane 41 surrounding the central stub of the resonator 42. If it does make sliding contact with the ground plane and the stub itself (FIG. 10), the capacitive load increases and therefore the adjustable frequency range increases as well; however sliding contacts are more difficult to manufacture and, if sliding is not continuous and an air gap between dielectric and ground plane or stub is created during movement, this will cause a sudden drop in capacitive load and a jump in frequency. Non contacting dielectric loads (FIG. 8) offer less capacitive load, but are less critical in adjustment and offer continuous frequency adjustability.

A capacitive load at the end of an open stub increases the effective electrical length of the stub itself. This decreases the frequency at which the stub is λ/4 long and therefore its series resonance frequency. This phenomenon is used to adjust the resonance frequency over several hundred MHz in the 2-3 GHz frequency range. This increases the effective frequency bandwidth of the open stub resonators from around 5% without adjustable capacitive load to over 30%.

Adjustment of the position of the dielectric cylinder 54, 60 with respect to the open stub 55,62 can be made either manually, using a simple or micrometric screw, or remotely, using a stepper motor and gear 81, 82. In general manual adjustment is simpler, but it requires on-line observation on a network analyzer in order to adjust the resonance frequency. Another possibility is to use a micrometric screw and pre-calibrate the positions versus resonance frequency.

An automatic adjustment of the position of the dielectric cylinder by means of a gear, lead screw and stepper motor can be fully automated and pre-calibrated. This may facilitate the operation, but, in this particular case, where the resonators are used for load pull measurements, which are typically single frequency operations, this feature is of lesser importance. However this version of the apparatus (FIGS. 15, 16) is also possible and may be used.

In an automatic configuration, where the position of the dielectric cylinder and resonance frequency are remotely controlled, the horizontal distance between resonators 119, 120 must also be automated and pre-calibrated. Otherwise automatic adjustability of the resonance frequency alone is not enough to maintain a fully automatic operation.

A variable short applied on a stub adjusts the effective electrical length of the stub [1]. This changes the frequency at which the stub is λ/2 long and therefore its series resonance frequency. This phenomenon is used to adjust the resonance frequency over several octaves in the GHz frequency range. This, theoretically, increases the effective frequency bandwidth of the open stub resonators from around 5% to whatever hardware limitations exist, depending on loss of the resonators, quality of sliding contacts and general dimensions of the airline.

However this, theoretically unlimited, adjustment range will be limited by technical difficulties in manufacturing the resonators and the sliding contacts.

Adjustment of the position of the sliding short 71, 89 can be made either manually, using a screw or remotely, using a stepper motor and gear 86, 87. In general manual adjustment is simpler, but it requires on-line observation on a network analyzer in order to adjust the resonance frequency. Another possibility is to use a micrometric screw and pre-calibrate the positions versus resonance frequency.

An automatic adjustment of the position of the sliding short by means of a gear, lead screw and stepper motor 86, 87 can be fully automated and pre-calibrated. This may facilitate the operation, but, in this particular case, where the resonators are used for load pull measurements, which are typically single frequency operations, this feature is of lesser importance. However this version of the apparatus is possible and may be used.

In an automatic configuration, where the position of the sliding short and resonance frequency are remotely controlled, the horizontal distance 119, 120 between resonators must also be automated and pre-calibrated. Otherwise automatic adjustability of the resonance frequency alone is not enough to maintain a fully automatic operation, since the electrical distance between resonators affects sensibly the overall reflection behavior of the tuner and creates several frequency jumps and spurious resonances if this distance is not adjusted very carefully.

In conclusion we propose practical configurations of harmonic rejection tuners, allowing full manual and automatic frequency adjustability, both using λ/4 open resonators using capacitive loads and capacitively shorted λ/2 resonators as well as mandatory adjustability of the physical distance between harmonic resonators.

Hereby I claim as my invention:

1. A harmonic rejection load pull tuner with an input (test) and an output (idle) port, a slotted airline between the two ports and a set of parallel resonator assemblies, made of central open stubs and external metallic walls, said central stubs being connected galvanically with the center conductor of said slotted airline in parallel and sliding along said center conductor of said airline, said open stubs being loaded dielectrically at their open end using cylinders made of dielectric material, and the whole resonator assembly sliding with good galvanic contact on top of said slotted airline, said dielectric cylinders can slide inside the metallic housing of said resonator assemblies and slide fitting closely over the open end of said resonator stubs; said dielectric cylinders are movable vertically and are insertable at adjustable depth inside the resonator housing and slide over the said resonator stubs, in order to adjust the capacitive load and thus the electrical length and resonance frequency of said open stubs.

2. A harmonic rejection tuner, as in claim 1, in which the vertical position of the dielectric cylinders sliding over the end of the open stubs can be adjusted manually.

3. A harmonic rejection tuner, as in claim 1, in which the horizontal distance between resonator assemblies can be adjusted manually.

4. A harmonic rejection tuner, as in claim 1, in which the horizontal position of the resonator assemblies can be adjusted automatically along said tuner airline, using stepper motors, translation gear and remote computerized control.

5. A harmonic rejection tuner, as in claim 4, in which the vertical position of the dielectric cylinders sliding over the end of the open stubs of said resonator assemblies can be adjusted automatically using stepper motors, translation gear and remote computerized control.

6. A harmonic rejection tuner, as in claim 4, in which the horizontal distance between resonator assemblies along the said tuner airline, can be adjusted automatically using stepper motors, translation gear and computerized control.

7. A harmonic tuner, as in claim 6, is calibrated by measuring said tuner's scattering parameters (s-parameters) between said test and idle ports on a calibrated vector network analyzer (VNA), as a function of calibration frequency and of horizontal position of said resonator assemblies sliding on said tuner airline, and as a function of vertical position of said dielectric cylinders inside the resonator assemblies and as a function of horizontal distance between said resonator assemblies, said calibration frequencies being close to and including the resonance frequency of said resonator assemblies, said scattering parameters being saved in calibration files for later use.

* * * * *